United States Patent [19]

Maruyama et al.

[11] Patent Number: 4,884,236

[45] Date of Patent: Nov. 28, 1989

[54] BLOCH LINE MEMORY DEVICE

[75] Inventors: Youzi Maruyama, Hachioji; Tadashi Ikeda, Kanagawa; Ryo Suzuki, Hachioji, all of Japan

[73] Assignee: Hitachi, Ltd., Tokyo, Japan

[21] Appl. No.: 106,346

[22] Filed: Oct. 9, 1987

[30] Foreign Application Priority Data

Oct. 9, 1986 [JP] Japan .................. 61-239010

[51] Int. Cl.$^4$ ............................. G11C 19/08
[52] U.S. Cl. ........................ 365/29; 365/37; 365/87
[58] Field of Search ............... 365/29, 87, 37

[56] References Cited

U.S. PATENT DOCUMENTS 4,583,200  4/1986  Konishi et al. .................. 365/29

FOREIGN PATENT DOCUMENTS 204888  9/1986  Japan ............................ 365/29

OTHER PUBLICATIONS

IEEE Transactions on Magnetics, vol. Mag-19, No. 5, Sept. (1983) pp. 1838–1840.
IEEE Transactions on Magnetics, vol. Mag-19, No. 5, Sept. (1983) pp. 1841–1843.
Electronics Product Design-Oct. 1985, pp. 69–72.
Journal of Applied Physics-Vol. 57, No. 1, Apr. 15, 1985, pp. 4071–4073.
IEEE Transactions on Magnetics-vol. Mag-21, No. 5, Sept. 1985, pp. 1770–1772.

Primary Examiner—James W. Moffitt
Attorney, Agent, or Firm—Antonelli, Terry & Wands

[57] ABSTRACT

A Bloch line memory device comprises stripe magnetic domains in a magnetic film for holding magnetic bubble domains. A pair of Bloch lines is stored as an information carrier in a magnetic wall constructing the stripe magnetic domain. A longitudinal direction of the stripe magnetic domain is made parallel to either the crystalographic directions $[11\bar{2}]$ and $[\bar{1}\bar{1}2]$, $[1\bar{2}1]$ and $[\bar{1}2\bar{1}]$, or $[\bar{2}11]$ and $[2\bar{1}\bar{1}]$ of the magnetic film so that the pair of Bloch lines can be smoothly moved in the magnetic wall of the stripe magnetic domain.

10 Claims, 4 Drawing Sheets

BLOCH LINE MEMORY DEVICE

BACKGROUND OF THE INVENTION

1. Field of the Invention

The present invention relates to a Bloch line memory device, and more particularly to the structure of stripe magnetic domains which stores vertical Bloch lines as information carriers.

2. Description of the Related Art

Like a magnetic bubble memory device, a Bloch line memory device uses a magnetic garnet film as a memory medium. The magnetic garnet film is formed such that its film plane has a (111) face. However, an information storing manner is greatly different between both the devices. Namely, in the magnetic bubble memory device, the presence or absence of a bubble domain corresponds to information of "1" or "0". In the Bloch line memory device, on the other hand, the presence or absence of a pair of Bloch lines in a magnetic wall enclosing a stripe magnetic domain which has a stretched magnetic domain form, corresponds to information of "1" or "0". This situation is illustrated in FIG. 1. Referring to the figure, an upward arrow 103 in a stripe magnetic domain 2 existing in a magnetic garnet film 6 represents the direction of magnetization in the stripe magnetic domain 2, and an arrow 5 in a magnetic wall 1 represents the direction of magnetization of the magnetic wall 1. Particularly, an arrow 101 on a center line in the magnetic wall 1 represents the direction of magnetization of the magnetic wall at a central portion of the magnetic wall 1. An arrow 102 perpendicular to the face of the magnetic wall 1 represents the direction of magnetization at a central portion of a vertical Bloch line (hereinafter referred to simply as Bloch line). A portion 4a where a pair of Bloch lines 3 exist corresponds to information of "1" while a portion 4b where no Bloch line exists corresponds to information of "0".

The pair 4a of Bloch lines 3 used as an information carrier is a microstructure of domain wall which exists in the magnetic wall 1 enclosing the stripe magnetic domain 2, as is shown in FIG. 1. The Bloch lines 3 exist stably in the magnetic wall 1 and can move freely in the magnetic wall 1. Therefore, if a multiplicity of the stripe magnetic domains 2 are arranged in a juxtaposing manner with the Bloch lines 3 in the magnetic walls of the respective stripe magnetic domains, a memory section like a minor loop of the magnetic bubble memory can be constructed.

The existence of such Bloch lines are known, and experiments and analyses thereof have demonstrated that the speed of movement of a magnetic domain becomes slower because of the existence of Bloch lines. In the magnetic bubble memory device in which magnetic domains must be moved, a magnetic domain including Bloch lines is called a hard bubble and efforts have been made to prevent the generation of such hard bubbles. On the other hand, in the Bloch line memory device, the existence of Bloch lines are positively utilized.

The physical dimension of a Bloch line is about one tenth of the width of a stripe magnetic domain having the Bloch line therein. Many Bloch lines can be included in one stripe magnetic domain. For example, in the case where there is used a magnetic garnet film, having been developed for use in a magnetic bubble memory, in which the width of the stripe magnetic domain is 1 $\mu$m, the stripe magnetic domain can involve about $5 \times 10^8$ Bloch lines per 1 cm². Accordingly, when two Bloch lines are paired as an information carrier, a memory in the class of 256 Mbit/cm² can be fabricated.

The Bloch lines have a reason other than the possession of its fine size why a memory having a large capacity can be provided. Namely, since in the Bloch line memory device a magnetic field in a direction perpendicular to a surface or film plane of the magnetic garnet film is used to propagate or transfer information though in the magnetic bubble memory device an information carrier is propagated by rotating an in-plane field, a propagation track pattern in the Bloch line memory device assumes a simplified planar configuration and construction, which facilitates an improvement in density of the device.

FIG. 2 shows an example of the propagation track pattern. A Bloch line pair 4 exists in a magnetic wall enclosing a stripe magnetic domain 2 which is present in a magnetic garnet film 6 formed on a substrate 9. The stripe magnetic domain 2 exists to enclose a grooving 8 formed in a part of the magnetic garnet film 6. The grooving 8 is one means for arranging many stripe magnetic domains 2 in juxtaposition relation with each other and fixing their positions. The Bloch line pair 4 is moved in the magnetic wall 1 by a magnetic field $H_P$ applied perpendicularly to the surface of the magnetic garnet film 6. In order that the Bloch line pair 4 is moved by a fixed amount at this time, a propagation track pattern 7 is provided on the stripe magnetic domain 2. The Bloch line pair 4 is fixed by an in-plane field 104 having the same direction as the magnetization 105 of a region enclosed by the Bloch line pair. By selecting the magnitudes of the perpendicular and in-plane fields $H_P$ and 104 so as to be within their predetermined ranges and applying the perpendicular field $H_P$ once, the Bloch line pair 4 can be moved below the next propagation track pattern 7. The requirement of the propagation track pattern 7 for realizing this operation is only to have a function of generating the in-plane field 104 and hence the pattern 7 may be provided by the repetition of a simple rectangular shape, as shown in FIG. 2.

As apparent from the above explanation, the Bloch line pair as an information carrier can freely move around the stripe magnetic domain, In order to write and read information, as required, it is necessary to dispose function sections at the outside of the memory section. A Bloch line memory is schematically shown in FIG. 3. The memory section is constructed of a multiplicity of juxtaposed stripe magnetic domains 2. The propagation track pattern 7 is provided crossing at an approximately right angle with respect to the stripe magnetic domains 2. Read and write function sections 121 and 120 are provided at the right and left sides of the stripe magnetic domains 2, respectively.

The writing of Bloch lines is effected by causing a current to flow through a conductor formed in the vicinity of a left end portion of the stripe magnetic domain 2 to generate a localized magnetic field so that the magnetization of the magnetic wall is inverted by 180°. Namely, the magnetization of the region 4b of "0" shown in FIG. 1 is inverted so as to take the direction of magnetization of the portion 4a of "1". At this time, the magnetization continuously changes at an interface between the inverted region and a non-inverted region to produce a state in which the magnetization is changed by 90° with respect to the magnetic wall. This state yields a Bloch line. Such Bloch lines are necessarily produced in a paired form and hence a memory is constructed by corresponding a pair of Bloch lines to one unit of information.

When it is desired to write "0" or no Bloch line pair in the stripe magnetic domain, a distance between the left end portion of the stripe magnetic domain 2 and the writing conductor is made large so that a magnetic field causing the inversion of magnetization does not act on the stripe magnetic domain 2. In order to distance only a desired stripe magnetic domain from the writing conductor, means is used which causes a magnetic bubble 10 to exist at the end portion of that stripe magnetic domain. The magnetic bubble 10 causes an electromagnetic repulsive force to act on the left end portion of the stripe magnetic domain 2, thereby contracting the stripe magnetic domain 2. As a result, the above-mentioned positional relation is realized between the writing conductor and the stripe magnetic domain 2. In order to cause magnetic bubbles to exist in the write function section 120, the write function section 120 is provided with a magnetic bubble transfer track 110 and a magnetic bubble generator 11. The magnetic bubble propagation track 110 transfers a magnetic bubble 10 from the magnetic bubble generator 11 to the left side of a predetermined stripe magnetic domain 2.

The reading of information is effected by converting the presence or absence of Bloch lines into the presence or absence of a magnetic bubble. For this conversion is used a method described by Konishi on pages 1838–1840 and 1841–1843 of IEEE TRANSACTIONS ON MAGNETICS, vol. Mag-19, No. 5 (1983). Namely, when a Bloch line is present, the directions of magnetization of the magnetic wall on the opposite sides of the Bloch line are inverted with respect to each other. Because of this change of the structure of domain wall, a change takes place with respect to the easiness of chopping of an end portion of the stripe magnetic domain when one Bloch line is moved to the end portion of the stripe magnetic domain. By selecting a predetermined chopping condition, therefore, the chopping of a magnetic bubble from the stripe magnetic domain can be made only in the case where one Bloch line is present at the end portion of the stripe magnetic domain. This chopping is carried out at the read function section 121. The chopped magnetic bubble is transferred through a propagation track 111 for read-out to a magnetic bubble detector 12 by which the presence of the magnetic bubble is converted into an electric signal. The presence or absence of this electric signal corresponds to the presence or absence of the magnetic bubble and hence the presence or absence of the Bloch lines (i.e. information) at the end portion of a predetermined stripe magnetic domain. In this way, the reading operation is carried out. Such a Bloch line memory device is described in detail by U.S. Pat. No. 4,583,200.

The above-described Bloch line memory device has a problem that information or Bloch line is trapped at the memory section or function section(s) so that the information is lost or deviates from a desired address position, thereby making accurate reading of information impossible. This problem will be explained by use of FIG. 4. FIG. 4 is a view showing the state of a stripe magnetic domain 2 existing in a magnetic garnet film 6 formed on a substrate 9. A Bloch line pair 4 is present in a magnetic wall 1 of the stripe magnetic domain 2. A conductor 14 is provided for controlling the position of the Bloch line pair 4. The conductor 4 assumes one of conductors included in the function sections 120 and 121 shown in FIG. 3. As apparent from FIG. 3, the conductor 14 is arranged crossing a longitudinal direction of the stripe magnetic domain 2 at an approximately right angle.

The conductor 14 is formed or worked by photolithography. Usually, since the thermal expansion coefficient of the conductor 14 is different from that of the magnetic garnet film 6, a residual stress remains after the formation of the conductor 14. This stress gives a change to a perpendicular magnetic anisotropy of the magnetic garnet film 6. Namely, a magnetic easy axis of the magnetic garnet film 6 is usually in a direction perpendicular to the film plane but the residual stress produced by the conductor 14 changes the magnetic easy axis just below the conductor 14 to a direction in the film plane. Therefore, there is exhibited a phenomenon that the magnetization 103' which is upward at the outside of the stripe magnetic domain 2 falls into the film plane at a portion 150 just below the conductor 14. This phenomenon takes place also in the magnetic wall 1 in which Bloch lines exist. When the falling of the magnetization into the film plane takes place, this in-plane magnetization acts as a resistance in moving a pair of Bloch lines. As a result, the Bloch lines are trapped by the in-plane magnetization, thereby making smooth propagation of the Bloch lines impossible.

A similar problem takes place also just below the propagation track pattern 7. This problem is common to all the patterns formed on the magnetic garnet film.

SUMMARY OF THE INVENTION

An object of the present invention is to provide a Bloch line memory device capable of smoothly moving a pair of Bloch lines in memory and function sections, thereby providing better operation characteristics.

As has already been mentioned, when a conductor pattern or the like is formed on a magnetic garnet film, a residual stress remains after the formation of the pattern. This residual stress disturbs the uniaxial magnetic anisotropy of the magnetic garnet film just below the pattern. The disturbance of the uniaxial anisotropy results in a resistance in moving a pair or Bloch lines or the occurrence of a trapping phenomenon which effects smooth movement of the pair of Bloch lines. To solve this problem, according to the present invention, the longitudinal direction of a stripe magnetic domain is made parallel to either the crystalographic directions $[11\bar{2}]$ and $[\bar{1}1\bar{2}]$, $[1\bar{2}1]$ and $[\bar{1}2\bar{1}]$, or $[\bar{2}11]$ and $[2\bar{1}\bar{1}]$ of a magnetic garnet film. Thus, any influence which the magnetization falling into the film plane of the magnetic garnet film gives to a pair of Bloch lines can be reduced, thereby realizing smooth propagation of the pair of Bloch lines.

The above and other objects and many of the attendant advantages of the present invention will be readily appreciated when reading the following detailed description with reference to the accompanying drawings.

DESCRIPTION OF THE PREFERRED EMBODIMENTS

An embodiment of the present invention will now be described referring to the accompanying drawings.

Figure 1:
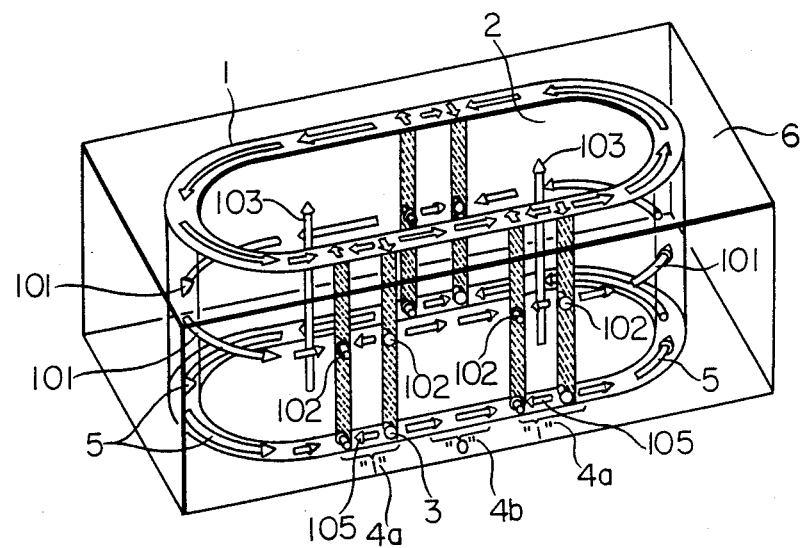
FIG. 1 is a view showing a stripe magnetic domain together with Bloch lines existing in a magnetic wall of the stripe magnetic domain.
Figure 2:
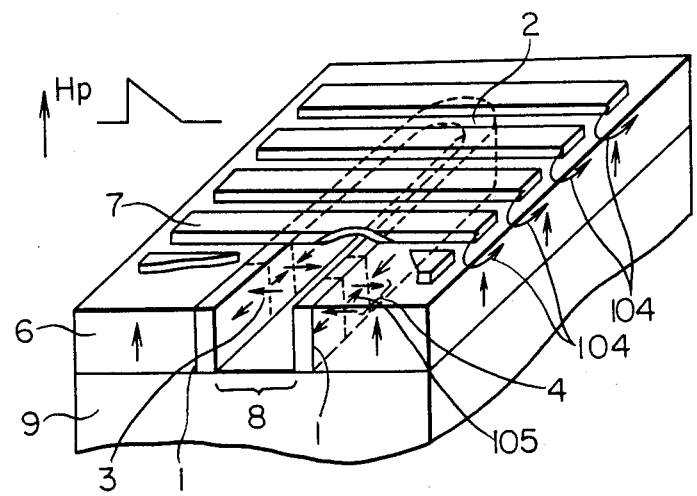
FIG. 2 is a view showing a part of stripe magnetic domain forming a memory section.
Figure 3:
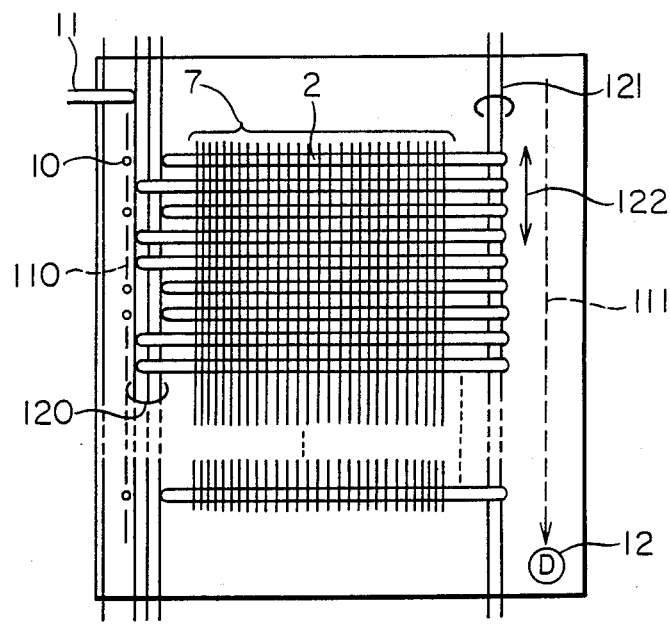
FIG. 3 is a view showing a general construction of a Bloch line memory device.

Most of conductor patterns constructing memory and function sections of a Bloch line memory device orthogonally cross stripe magnetic domains 2 constructing a minor loop, as is shown in FIG. 3. This is because a magnetic field in the tangential direction of a magnetic wall including Bloch lines therein is necessary to drive the Bloch lines.

Figure 4:
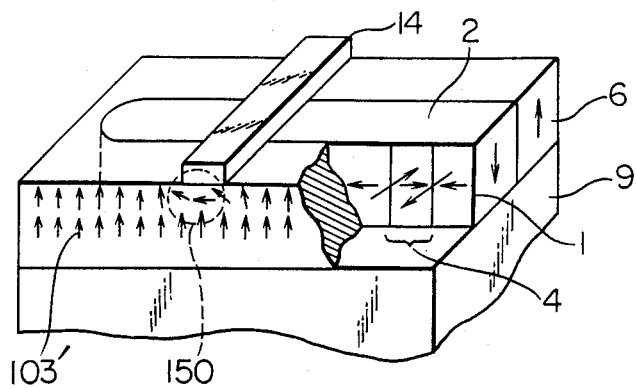
FIG. 4 is a view for explaining influence which a residual stress remaining in a conductor or the like gives to the uniaxial magnetic anisotropy of a magnetic garnet film.

The conductor pattern involves a residual stress which is unnecessary for the operation of the device. The residual stress is inevitably produced in fabricating the device. This residual stress is mainly generated because of a difference in thermal expansion coefficient between the material of the conductor pattern and a magnetic garnet film. It will be understood that the residual stress mainly acts on a longitudinal direction of the conductor pattern. Namely, the residual stress is liable to generate in the direction 122 of width of the stripe magnetic domain 2. When the residual stress acts on the perpendicularly magnetized garnet film, the magnetization of the film surface accepting most strongly the stress falls in the in-plane direction (see the portion 150 in FIG. 4). This phenomenon is called a magnetostriction effect.

Figure 5A:
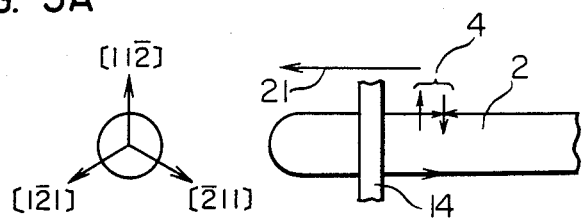
FIGS. 5A and 5B are views for explaining the presence and absence of the occurrence of a Bloch line pair trapping error resulting from a relation between the magnetic easy axis of a magnetic garnet film and the longitudinal direction of a stripe magnetic domain.

In the case of a perpendicularly magnetized garnet film, it is known that the magnetostriction effect is different depending on the crystallographic direction because of the tri-fold symmetry of the crystal. The directions which are liable to the magnetostriction effect are $[11\bar{2}]$ and $[\bar{1}12]$, $[\bar{2}11]$ and $[2\bar{1}\bar{1}]$, and $[1\bar{2}1]$ and $[\bar{1}2\bar{1}]$. When those crystallographic directions are parallel to the longitudinal direction 21 of a conductor pattern 14, as shown in FIG. 5A, the magnetization is liable to be directed to the in-plane direction. Accordingly, when the conductor pattern 14 is formed in parallel to these crystallographic directions, a strong in-plane magnetization layer is formed just below the conductor 14. The direction of magnetization of this in-plane magnetization layer is fixed. Therefore, when a Bloch line pair 4 passes just below the conductor 14, the Bloch line pair 4 is trapped by the in-plane magnetization layer, thereby causing an erroneous operation.

Figure 5B:
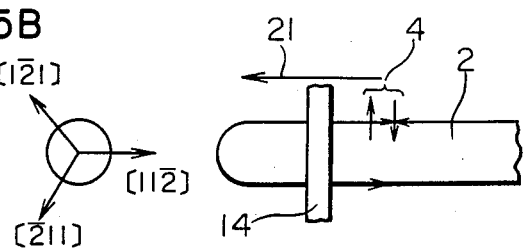

On the other hand, if the longitudinal direction 21 of the stripe magnetic domain 2 is selected to be parallel to either the crystallographic directions $[11\bar{2}]$ and $[\bar{1}12]$, $[1\bar{2}1]$ and $[\bar{1}2\bar{1}]$, or $[211]$ and $[2\bar{1}\bar{1}]$, as shown in FIG. 5B, the formation of the in-plane magnetization layer is hard to take place since the residual stress of the longitudinal direction of the conductor 14 does not coincide with the magnetic easy axis of the perpendicularly magnetized garnet film. Accordingly, the problem that the Bloch line pair 4 is trapped just below the conductor 14 is eliminated and hence a better operation margin can be obtained.

Figure 6A:
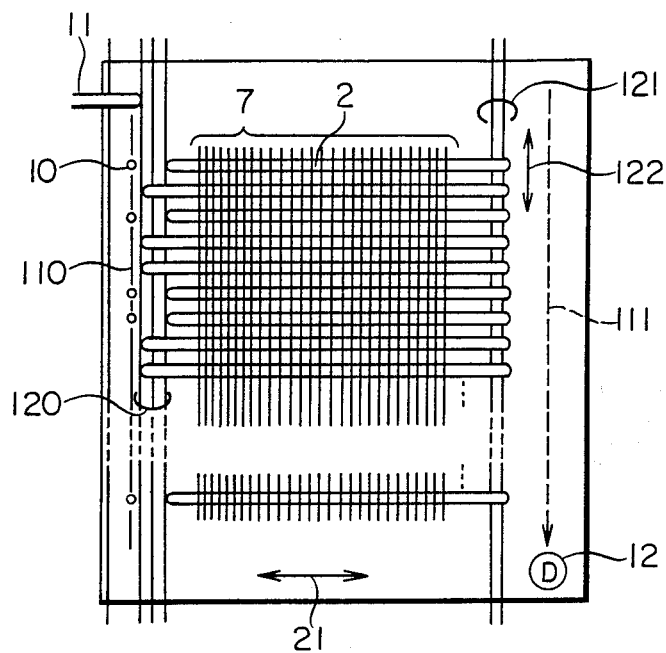
FIGS. 6A and 6B are views showing a Bloch line memory device according to an embodiment of the present invention.

FIG. 6A is a view showing a general construction of a Bloch line memory device embodying the present invention. The constructions of memory and function sections of the Bloch line memory device in FIG. 6A are the same as those in FIG. 3. But, the embodiment of FIG. 6A is different from the device of FIG. 3 in that stripe magnetic domains 2 are disposed with their longitudinal direction 21 parallel to the crystalographic directions $[11\bar{2}]$ and $[\bar{1}12]$, $[1\bar{2}1]$ and $[\bar{1}2\bar{1}]$, or $[\bar{2}11]$ and $[2\bar{1}\bar{1}]$ of a perpendicularly magnetized garnet film, as is apparent from FIG. 6B.

As the perpendicularly magnetized garnet film was used $(Y_{2.6}Sm_{0.4})(Fe_4Ga_1)O_{12}$ grown on a (111) face of a $Gd_3Ga_5O_{12}$ substrate. A pattern of groovings for fixing stripe magnetic domains was formed in the perpendicularly magnetized garnet film. Next, $SiO_2$ was deposited on the perpendicularly magnetized garnet film by a process similar to a usual process for fabrication of semiconductor devices. A propagation track pattern 7 was formed on the $SiO_2$ film. On the pattern 7 was deposited $SiO_2$ again. Further, Au was deposited by evaporation and a conductor pattern 14 was then formed by photolithography. A multiplicity of stripe magnetic domains 2 were arranged at positions where they intersect the conductor pattern at right angles, thereby constructing a minor loop or a memory section for storage of information.

Figure 6B:
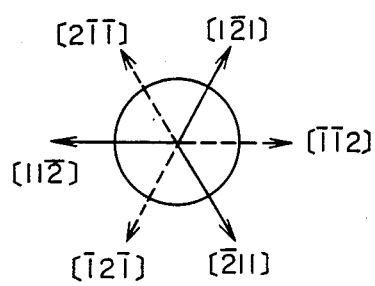

The longitudinal direction 21 of the stripe magnetic domain 2 was made parallel to the crystallographic directions $[11\bar{2}]$ and $[\bar{1}12]$, as shown in FIGS. 6A and 6B. A similar effect was obtained when the longitudinal direction 21 of the stripe magnetic domain 2 is selected to be parallel to $[2\bar{1}\bar{1}]$ and $[\bar{2}11]$, or $[\bar{1}2\bar{1}]$ and $[1\bar{2}1]$.

In the above, the present invention has been described in conjunction with the embodiment. A feature of the present invention lies in that the longitudinal directions of stripe magnetic domains constructing a memory section for storage of information are made parallel to the crystallographic directions $[11\bar{2}]$ and $[\bar{1}12]$, $[1\bar{2}1]$ and $[\bar{1}2\bar{1}]$, or $[\bar{2}11]$ and $[2\bar{1}\bar{1}]$ of the perpendicularly magnetized garnet film. accordingly, it is of course that the present invention is applicable to a Bloch line memory device which has a construction other than the above-described embodiment.

If the stripe magnetic domains are arranged in the above-mentioned directions, the Bloch line transfer or propagation margin is not deteriorated even under the existence of a residual stress in the conductor pattern since the magnetization direction of the Bloch line does not coincide with the magnetic easy axis of the magnetic garnet film just below the conductor.

We claim:

1. A Bloch line memory device comprising:
   a magnetic film for holding magnetic bubble domains, said magnetic film being formed on a substrate so that its film plane has a (111) face;
   a plurality of stripe magnetic domains formed in said magnetic film, each of the stripe magnetic domains being arranged to enclose a different one of groovings formed in a part of said magnetic film, the stripe magnetic domains having a Bloch line pair as an information carrier in the magnetic wall of the stripe magnetic domain, the stripe magnetic domain being arranged with its longitudinal direction in parallel to either the crystallographic directions, $[11\bar{2}]$ and, $[\bar{1}12]$, $[1\bar{2}1]$ and, $[\bar{1}2\bar{1}]$, or $[\bar{2}11]$ and $[2\bar{1}\bar{1}]$ of said magnetic film;

write means for writing the Bloch line pair in the stripe magnetic domain in accordance with information; and read means for reading information on the basis of the presence or absence of the Bloch line pair in the stripe magnetic domain.

2. A Bloch line memory device according to claim 1, wherein said magnetic film is a magnetic garnet film.

3. A Bloch line memory device according to claim 1, wherein said write means includes generation means for generating a magnetic bubble domain in accordance with information, transfer means for propagating the magnetic bubble domain from said generation means to one end side of a predetermined one of the stripe magnetic domains in its longitudinal direction, and means for writing the Bloch line pair in said predetermined stripe magnetic domain in accordance with the presence or absence of said magnetic bubble domain, the last-mentioned means including a conductor pattern provided crossing the longitudinal direction of the stripe magnetic domain.

4. A Bloch line memory device according to claim 1, wherein said read means includes means for chopping a magnetic bubble domain from the stripe magnetic domain in accordance with the presence or absence of the Bloch line pair in the stripe magnetic domain, the chopping means including a conductor pattern provided at the other end side of the stripe magnetic domain in its longitudinal direction to cross the longitudinal direction, and means for reading as information the presence or absence of the magnetic bubble domain chopped from the stripe magnetic domain.

5. A Bloch line memory device according to claim 1, further comprising means for fixing the Bloch line pairs in the stripe magnetic domains to predetermined positions, the fixing means including a plurality of propagation track patterns provided crossing the longitudinal directions of said stripe magnetic domains.

6. A Bloch line memory device comprising a multiplicity of stripe magnetic domains existing in a perpendicularly magnetized garnet grown on a (111) face of a non-magnetic garnet substrate, each of the multiplicity of stripe magnetic domains being arranged to enclose a different one of groovings formed in a part of the perpendicularly magnetized garnet, Bloch lines existing as an information carrier in a magnetic wall of the boundary of the stripe magnetic domain, the multiplicity of stripe magnetic domains being parallelly arranged to construct a memory section for storage of information, a longitudinal direction of the stripe magnetic domain being selected to be parallel to either the crystalographic directions $[\bar{1}12]$ and $[11\bar{2}]$, $[2\bar{1}\bar{1}]$ and $[\bar{2}11]$, or $[121]$ and $[121]$ of the perpendicularly magnetized garnet.

7. A Bloch line memory device according to claim 1, wherein each of the groovings formed in said magnetic film extends in a substantial portion of said magnetic film in a direction toward said substrate.

8. A Bloch line memory device according to claim 7, wherein each of said groovings extends through said magnetic film to said substrate.

9. A Bloch line memory device according to claim 6, wherein each of the groovings formed in said magnetized garnet extends in a substantial portion of said magnetized garnet in a direction toward said face of said substrate.

10. A Bloch line memory device according to claim 9, wherein each of said groovings extends through said magnetized garnet to said face of said substrate.

* * * * *